United States Patent
Konomi

(10) Patent No.: US 8,127,256 B2
(45) Date of Patent: Feb. 28, 2012

(54) PATTERN DATA GENERATION METHOD, DESIGN LAYOUT GENERATING METHOD, AND PATTERN DATA VERIFYING PROGRAM

(75) Inventor: Kenji Konomi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 664 days.

(21) Appl. No.: 12/252,978

(22) Filed: Oct. 16, 2008

(65) Prior Publication Data

US 2009/0119627 A1    May 7, 2009

(30) Foreign Application Priority Data

Oct. 18, 2007    (JP) .................................. 2007-271512

(51) Int. Cl.
*G06F 17/50*    (2006.01)

(52) U.S. Cl. .......................................... 716/51; 716/55

(58) Field of Classification Search ............... 716/50–55
See application file for complete search history.

(56) References Cited

U.S. PATENT DOCUMENTS 6,060,368 A    5/2000 Hashimoto et al.
(Continued)

FOREIGN PATENT DOCUMENTS

JP    10-171855    6/1998
(Continued)

OTHER PUBLICATIONS

Notice of Reasons for Rejection, issued by Japanese Patent Office, dated Sep. 27, 2011, in a Japanese patent application No. 2007-271512, 3 pages.

*Primary Examiner* — Stacy Whitmore

(74) *Attorney, Agent, or Firm* — Finnegan, Henderson, Farabow, Garrett & Dunner, L.L.P.

(57) ABSTRACT

A pattern data generation method according to an example of the present invention includes based on design pattern data of a circuit including a plurality of MIS transistors having the same gate size, identifying types of the plurality of MIS transistors, setting size specs for gate patterns of the plurality of MIS transistors, the size specs being different for different types of the MIS transistors, and verifying whether gate patterns of the MIS transistors predicted by simulation using mask pattern data for forming the MIS transistors satisfy the size specs.

20 Claims, 4 Drawing Sheets

U.S. PATENT DOCUMENTS

| | | |
|---|---|---|
| 6,665,858 B2 * | 12/2003 | Miyazaki ............... 430/319 |
| 7,031,898 B2 * | 4/2006 | Jain et al. ............... 703/14 |
| 7,228,523 B2 | 6/2007 | Kobayashi |
| 7,560,200 B2 * | 7/2009 | Tamaki ............... 430/5 |
| 7,721,244 B2 * | 5/2010 | Ono ............... 716/126 |
| 2004/0034844 A1 * | 2/2004 | Beerel et al. ............... 716/18 |
| 2004/0054979 A1 * | 3/2004 | Bobba et al. ............... 716/13 |
| 2006/0083995 A1 | 4/2006 | Kanai |
| 2011/0047523 A1 * | 2/2011 | Garcia et al. ............... 716/122 |

FOREIGN PATENT DOCUMENTS

| | | |
|---|---|---|
| JP | 2001-159809 | 6/2001 |
| JP | 2002-62633 | 2/2002 |
| JP | 2002-341514 | 11/2002 |
| JP | 2003-142584 | 5/2003 |
| JP | 2004-341157 | 12/2004 |
| JP | 2005-10635 | 1/2005 |
| JP | 2005-284272 | 10/2005 |
| JP | 2006-53248 | 2/2006 |

* cited by examiner

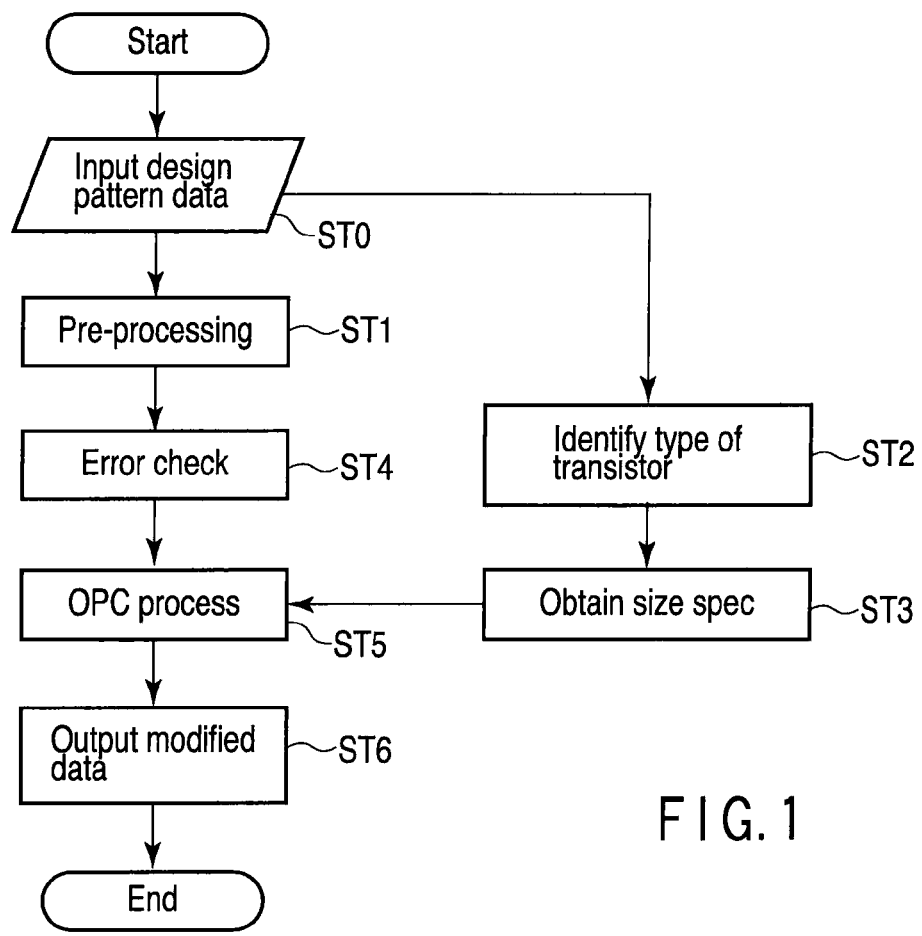
F I G. 1
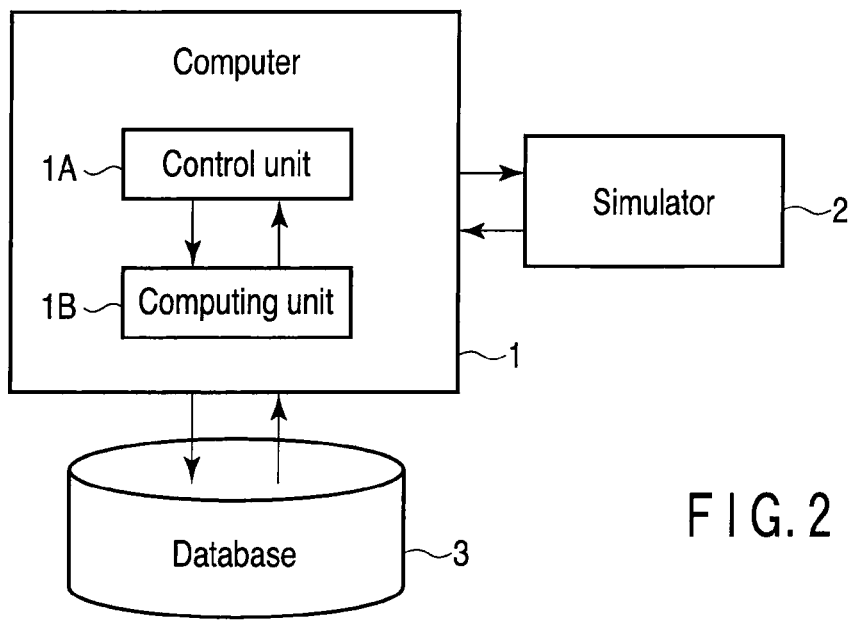
F I G. 2

PATTERN DATA GENERATION METHOD, DESIGN LAYOUT GENERATING METHOD, AND PATTERN DATA VERIFYING PROGRAM

CROSS-REFERENCE TO RELATED APPLICATIONS

This application is based upon and claims the benefit of priority from prior Japanese Patent Application No. 2007-271512, filed Oct. 18, 2007, the entire contents of which are incorporated herein by reference.

BACKGROUND OF THE INVENTION

1. Field of the Invention

The present invention relates to a pattern data generation method and a design layout generating method, and more particularly, to a correction/verification process for gate patterns of transistors.

2. Description of the Related Art

In recent years, in a semiconductor integrated circuit, the formation of finer patterns of elements and wiring that compose the circuit has been promoted further. Along with that, there is a demand for a reduction in variations in the size of patterns. Particularly, when, in a process of forming gates of Metal-Insulator-Semiconductor (MIS) transistors, variations occur in the size thereof, the performance of the entire semiconductor integrated circuit is largely affected thereby.

Thus, fine patterns need to be accurately formed and an optical proximity correction (OPC) processing technique and a simulation technique for verifying correction results are necessary (see, for example, Jpn. Pat. Appln. KOKAI Publication No. 2006-53248).

Here, a verification simulation is performed for checking, when mask patterns that are corrected by the OPC process are transferred onto a wafer, what shape the transferred patterns will take. By this, it is verified that the patterns obtained by simulation match desired patterns.

In addition, when taking into account variations resulting from a process in, for example, the focal location or irradiated light exposure of an exposure apparatus used in a lithography process, it is checked whether all patterns fall within a set size range (hereinafter, referred to as the size spec).

In a verification simulation performed so far, the size spec is determined according to, for example, a difference in pattern size, gate, and wiring and normally the same size spec is applied to gate lengths of the same size. However, in a design layout, the setting range of the size spec is defined by a small range, regardless of the type of transistor.

On the other hand, along with the formation of finer patterns, margin of variations resulting from a process is reduced. Therefore, it tends to become difficult to compensate for a strict size spec that is common for all gate patterns.

BRIEF SUMMARY OF THE INVENTION

A pattern data generation method of an aspect of the present invention comprises: based on design pattern data of a circuit including a plurality of MIS transistors having the same gate size, identifying types of the plurality of MIS transistors; setting size specs for gate patterns of the plurality of MIS transistors, the size specs being different for different types of the MIS transistors; and verifying whether gate patterns of the MIS transistors predicted by simulation using mask pattern data for forming the MIS transistors satisfy the size specs.

A design layout generating method of an aspect of the present invention comprises: based on design pattern data of a circuit including a plurality of MIS transistors having the same gate size, identifying types of the plurality of MIS transistors; setting size specs for gate patterns of the plurality of MIS transistors, the size specs being different for different types of the MIS transistors; and modifying design pattern data of the gate patterns of the MIS transistors such that gate patterns of the MIS transistors predicted by simulation using mask pattern data for forming the MIS transistors satisfy the size specs.

A computer-readable program which is for verifying data and the program which causes the computer to execute the following items of an aspect of the present invention, the program comprises: based on design pattern data of a circuit including a plurality of MIS transistors having the same gate size, identifying types of the plurality of MIS transistor; setting size specs for gate patterns of the plurality of MIS transistors, the size specs being different for different types of the transistor; and verifying whether gate patterns of the MIS transistors predicted by simulation by simulation using mask pattern data forming the MIS transistor satisfy the size spec.

BRIEF DESCRIPTION OF THE SEVERAL VIEWS OF THE DRAWING

FIG. 1 is a flowchart showing a pattern data generating method of a first embodiment;

FIG. 2 is a block diagram showing a basic configuration of an apparatus for implementing the first embodiment;

DETAILED DESCRIPTION OF THE INVENTION

Figure 3:
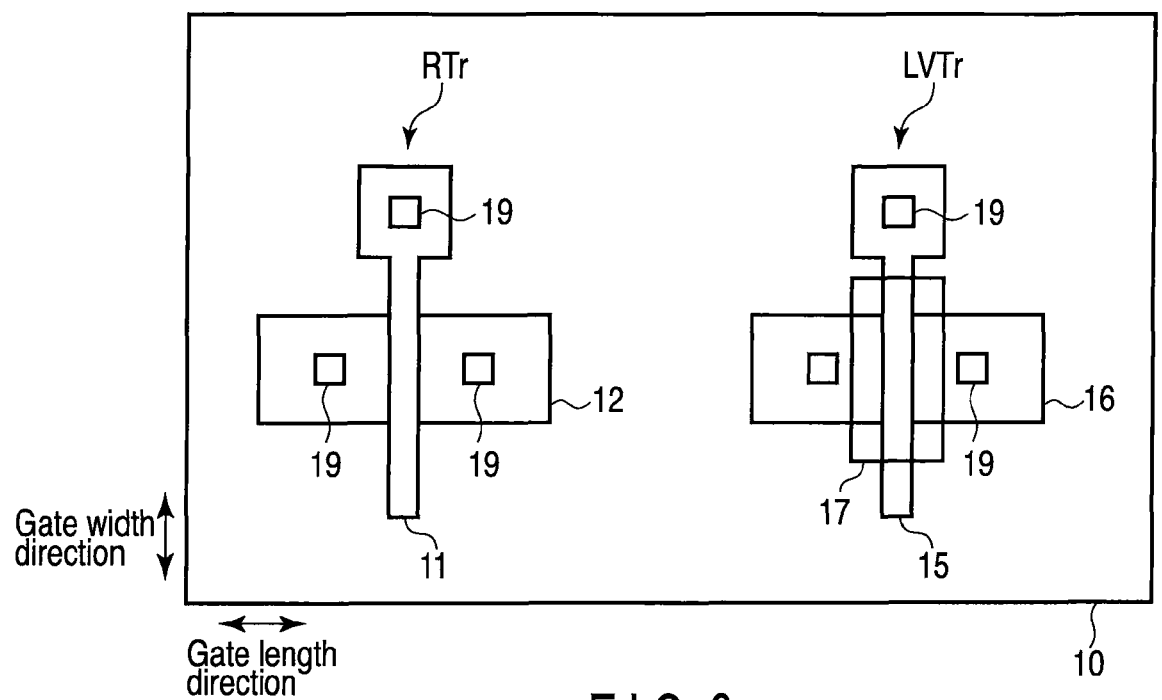
FIG. 3 is a diagram showing an example of pattern data of the first embodiment.

Several embodiments for implementing examples of the present invention will be described in detail below with reference to the drawings.

1. Outline

In a pattern data generating method of an embodiment of the present invention, an OPC process is performed on pattern data units for forming MIS transistors which are designed with the same gate size regardless of the type (characteristic) of MIS transistor, such that the pattern data units satisfy their respective size ranges (hereinafter, referred to as the size specs) set differently for different types of the MIS transistors.

Therefore, in conventional cases, an OPC process is performed on gate patterns of MIS transistors of different types by using the same strict (narrow setting range) size spec; on the other hand, according to the embodiment of the present invention, an OPC process for patterns can be performed such that different size specs are set for different types of MIS transistors within a range where operating characteristics required by the respective MIS transistors are satisfied, and margin of size spec is secured for each type of MIS transistor.

Also, in an embodiment of the present invention, OPC verification for pattern data will be described. In a pattern data verification method described in the embodiment of the present invention, whether an OPC process is appropriate is verified for MIS transistors of the same gate size by using size specs that are different for different types (characteristics) of the MIS transistors. According to this, whether corrections are appropriate can be verified using size specs in which MIS transistors satisfy operations required by the respective types thereof and margin is secured.

As described above, according to the embodiments of the present invention, an accurate correction process/verification process can be performed within size specs in which MIS transistors satisfy their respective required operating characteristics. Hence, the performance of the entire semiconductor integrated circuit and manufacturing yields can be improved. Accordingly, since a correction process/verification process can be performed using size specs that secure exposure margin, the development period of a semiconductor integrated circuit can be reduced.

In addition, in an embodiment of the present invention, a pattern correction method at the time of the OPC process will be described.

2. Embodiments

(1) First Embodiment

A first embodiment which is an example of the present invention will be described below with reference to FIGS. 1 to 4. FIG. 1 is a flowchart showing a processing flow of a pattern data generating method of the first embodiment of the present invention. FIG. 2 shows a basic configuration of an apparatus for generating pattern data shown in FIG. 1.

The apparatus shown in FIG. 2 includes a computer 1, a simulator 2, and a database 3. The computer 1 includes a control unit 1A and a computing unit 1B. The control unit 1A has, for example, software for performing processes of the present embodiment on input design pattern data and causes the computing unit 1B to perform a process shown in FIG. 1. The simulator 2 performs, for example, a process simulation by a lithography process. The database 3 stores a plurality of size spec data units indicating allowable size ranges for respective types of elements.

The processing flow of the pattern data generating method shown in FIG. 1 will be described below. Note that, in the embodiment of the present invention, description is made using MIS transistors as an example of elements that are correction targets.

First, design pattern data is input to the computing unit 1B of the computer 1 (ST0). The design pattern data includes a plurality of design patterns (also called layers) respectively corresponding to a plurality of fabrication processes of a semiconductor integrated circuit. That is, the design patterns respectively correspond to gate design patterns, source/drain layout design patterns, etc., of MIS transistors composing a semiconductor integrated circuit. Based on these design patterns, final mask patterns and a semiconductor integrated circuit corresponding to the mask patterns are formed. In the present embodiment, in the design pattern data, the sizes (gate lengths) of gate patterns of MIS transistors composing a semiconductor integrated circuit are designed with the same size, regardless of the type of MIS transistor. Note that the design pattern data is represented by x-y plane coordinates.

Then, pre-processing for an OPC process, such as arrangement of assist patterns, is performed on the input design pattern data by the computer 1 (ST1). At the same time, based on the input design pattern data, types of MIS transistors are identified and coordinates thereof are obtained by the computer 1 (ST2).

Here, a method of identifying types of MIS transistors will be described using FIG. 3. In the present embodiment, the case of identifying MIS transistors having different threshold voltages will be described. FIG. 3 shows pattern data 10 for forming a standard MIS transistor RTr and a low-voltage MIS transistor LVTr on a semiconductor substrate. Note that in the present embodiment, a MIS transistor whose threshold voltage exists between a high threshold voltage of a high-voltage MIS transistor and a low threshold voltage of a low-voltage MIS transistor LVTr is referred to as the standard MIS transistor RTr.

The MIS transistors RTr and LVTr respectively include, as main components, gate electrodes 11 and 15 and diffusion layers 12 and 16 serving as sources/drains, and further include contact portions 19 connected to the gate electrodes 11 and 15 and the diffusion layers 12 and 16.

Here, in the low-voltage MIS transistor LVTr which requires a high-speed operation, to reduce the threshold voltage, in a wafer process, ions are implanted into a channel region 17 of the low-voltage MIS transistor LVTr. On the other hand, upon the ion implantation process performed on the channel region of the low-voltage MIS transistor, ion implantation is not performed on a channel region of the standard MIS transistor RTr. The high-voltage MIS transistor is also the same as the standard MIS transistor.

Thus, a design pattern corresponding to a mask pattern used in the ion implantation process for threshold value adjustment is a pattern having an opening only in a portion corresponding to the channel region 17 of the low-voltage MIS transistor. Therefore, by a design pattern for a channel region ion implantation process, the low-voltage MIS transistor can be identified. Similarly to this, the respective types of the high-voltage MIS transistor and the standard MIS transistor can also be identified by whether there is an opening corresponding to a channel region in a design pattern. Based on the identification results, the locations of the MIS transistors whose types have been identified are represented by x-y coordinates and the coordinates thereof are obtained by the computer 1.

Note that although in the present embodiment, as a method of identifying MIS transistors having different threshold voltages, a method of identifying the MIS transistors based on design pattern data corresponding to a mask pattern used in a channel region ion implantation process is described, the identification method is not limited thereto. For example, a low-voltage MIS transistor and a standard MIS transistor are provided in well regions formed within a semiconductor substrate. In contrast, a high-voltage MIS transistor is arranged in a well region with a lower impurity concentration than that of the low-voltage MIS transistor or in a region where a well is not formed, in order to improve voltage transfer capability. Thus, the low-voltage MIS transistor and the high-voltage MIS transistor have different well formation processes. Therefore, from design pattern data corresponding to a mask pattern used in a well region formation process, types of MIS transistors having different threshold voltages can also be identified.

Similarly to this, there may be a case in which the film thickness and material of a gate insulating film and the film thickness and material of a gate electrode are different for different types of MIS transistors. In this case, since a gate insulating film formation process and a gate electrode formation process are also separately performed, types of MIS transistors may be identified by design pattern data corresponding to mask patterns used in such processes.

After the types of MIS transistors are identified, size spec data provided for the respective types of MIS transistors is read from the database 3. The read data is obtained by the computer 1 and set as size specs for correction (ST3). The size specs are differently set for different types of MIS transistors. In the present embodiment, a size spec corresponds to a range of a gate length of a gate pattern of a MIS transistor.

Here, using FIG. 4, an example of size specs set for respective types of transistors will be described. In the present embodiment, an example will be described in which, as described above, different size specs are set for different MIS transistors having different threshold voltages.

Figure 4:
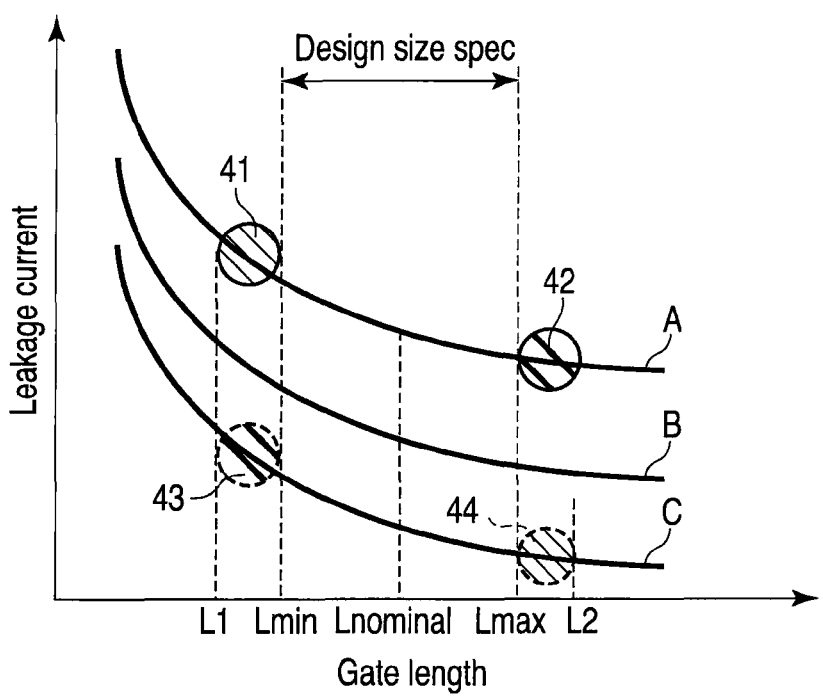
FIG. 4 is a diagram for describing size specs of transistors.

FIG. 4 is a graph showing a relationship between the gate length L and leakage current $I_{leak}$ of three types of MIS transistors having different threshold voltages. In design pattern data of the present embodiment, gate lengths (hereinafter, referred to as the design gate lengths) of gate patterns of the three types of MIS transistors are designed with the same size and the design gate lengths are set within a range (Lmin<L<Lmax) of a size spec serving as the reference. In the following, the size spec of the design pattern data is referred to as the design size spec. A value Lnominal serving as the reference in the range of the design size spec is referred to as the nominal gate length. The design size spec is set to a range in which a lower-limit (Lmin) side and an upper-limit (Lmax) side are symmetric to each other with respect to the nominal gate length Lnominal.

In FIG. 4, a characteristic line A represents an L-$I_{leak}$ characteristic of a low-voltage MIS transistor, a characteristic line B represents an L-$I_{leak}$ characteristic of a standard MIS transistor, and a characteristic line C represents an L-$I_{leak}$ characteristic of a high-voltage MIS transistor.

The need to consider a leakage current is less in the low-voltage MIS transistor than in the high-voltage and standard MIS transistors. Thus, a region 41 corresponding to a gate length thinner (smaller) than the design size spec lower limit (Lmin) may be used as an allowable range. On the other hand, the low-voltage MIS transistor requires a high-speed operation. Thus, when the gate length is thick (large), the drive current of the low-voltage MIS transistor decreases and accordingly the operating speed of the entire circuit decreases. Hence, for the size spec upper limit, the gate length is strictly controlled so as not to include a region 42 corresponding to a gate length thicker (larger) than the design size spec upper limit (Lmax).

Namely, a size spec (hereinafter, referred to as the correction size spec), which is applied to the size of a gate pattern when a correction by an OPC process is made to pattern data corresponding to a design pattern of a gate of the low-voltage MIS transistor, is set to a range of L1<L<Lmax. Note that the correction size spec is obtained so as to correspond to the size of a pattern predicted by simulation performed based on a mask pattern (here, the gate pattern of the low-voltage MIS transistor).

Thus, in the low-voltage MIS transistor, the correction size spec on the lower-limit side of the gate length thereof can secure a higher exposure margin than the lower-limit side of the design size spec.

As described above, when pattern data corresponding to a gate pattern of a MIS transistor is corrected by an OPC process, a size spec that is within a range where an operating characteristic required by a low-voltage MIS transistor can be compensated for and that is of a wider range than the design size spec can be secured.

In the high-voltage MIS transistor, the leakage current needs to be suppressed. Therefore, for the lower-limit side of the size spec, the gate length is strictly controlled so as not to include a region 43 corresponding to a gate length narrower than the lower limit (Lmin) of the design size spec. However, in the high-voltage MIS transistor, for the upper limit of the gate length thereof, there is almost no problem in the gate length becoming thicker than the upper limit of the design size spec. Hence, in the high-voltage MIS transistor, a region 44 corresponding to a gate length thicker than the upper limit of the design size spec is also set as an allowable range.

In this case, the correction size spec of the high-voltage transistor is in a range of Lmin<L<L2, and thus when pattern data corresponding to a gate pattern is corrected, a size spec of a wider range than the design size spec can be secured. Hence, in the high-voltage, the respective correction size specs on the upper-limit side of the gate lengths thereof can secure a higher exposure margin than the upper-limit side of the design size spec.

Note that in the standard MIS transistor, pattern data is modified by, for example, a correction size spec of the same setting range as the design size spec. Therefore, in the correction size spec of the standard MIS transistor, a correction (OPC process) is performed in a range of Lmin<L<Lmax. Note that the correction size spec of the standard MIS transistor may be the same as the correction size spec of the high-voltage MIS transistor.

As such, when gate patterns of MIS transistors of different types are designed with the same size, upon modifying mask pattern data by an OPC process, size specs that are within a range where operating characteristics required by high-voltage and low-voltage MIS transistors can be compensated for and that are of a wider range than the design size spec can be secured. Note that as an example of the above-described size specs, when the design size spec is set such that the lower-limit value Lmin=35 nm and the upper-limit value Lmax=45 nm, a correction size spec is set to, for example, 30 nm<L<45 nm for a low-voltage MIS transistor. For a standard MIS transistor a correction size spec is set to 35 nm<L<45 nm, and for a high-voltage MIS transistor a correction size spec is set to 35 nm<L<55 nm. Note that correction size specs may be determined in advance by an experiment and stored in the database 3 as data or may be input to the computer 1 whenever necessary.

Subsequently, for an error check process (ST4) in which an area (hereinafter, referred to as the process risk area) where breakage, short-circuit, or the like, resulting from a proximity effect may occur is determined, a lithography simulation, for example, is performed on the pattern data obtained after pre-processing. By the lithography simulation, gate patterns of the MIS transistors based on the design pattern data are predicted.

Then, an OPC process is performed on the design pattern data by the computer 1 such that the gate patterns of the MIS transistors predicted by simulation based on the design patterns corresponding to the gate patterns of the respective MIS transistors whose types have been identified at step ST2 satisfy the correction size specs set at step ST3 (ST5). As a result, mask pattern data based on the design pattern data is modified and generated.

Upon the OPC process, in the gate pattern of the low-voltage MIS transistor, with reference to the nominal gate length Lnominal of the design size spec, the correction size spec on the lower-limit side is secured in a wider range than the correction size spec on the upper-limit side. Therefore, a mask pattern corresponding to the gate pattern of the low-voltage MIS transistor is corrected using tolerances that are different between the lower-limit side and the upper-limit side with respect to the nominal gate length Lnominal.

Similarly to this, for the gate pattern of the high-voltage MIS transistor, in contrast to the low-voltage MIS transistor, the correction size spec on the upper-limit side is secured so as to be of a wider range than the correction size spec on the lower-limit side. Therefore, a mask pattern corresponding to the gate pattern of the high-voltage MIS transistor is corrected using tolerances that are different between the lower-limit side and the upper-limit side. By thus correcting a design pattern such that the design pattern falls within the range of a predetermined different size spec, it is possible to reduce the frequency of repeatedly performing a correction process on a mask pattern corresponding to one gate pattern until a requirement for an allowable range is satisfied.

Thereafter, by the design pattern data being subjected to an OPC process, mask pattern data is generated. The mask pattern data is output as modified data (ST6). Then, after a verification process such as timing verification is performed on the modified data, masks are manufactured based on the data.

As described above, in a pattern data correction process of the present embodiment, size specs (correction size specs) of gate patterns of MIS transistors which are applied to correction are set differently for different threshold voltages of the MIS transistors. Then, design pattern data corresponding to the gate patterns of the MIS transistors is subjected to an OPC process so as to fall within the range of the size specs (correction size specs) and mask pattern data is generated.

Hence, according to the first embodiment of the present invention, in gate patterns of MIS transistors of the same design size, without using the same strict size spec for the MIS transistors having different operating characteristics in a design layout, but by using correction size specs that secure exposure margin within a range where the operating characteristics required by the respective transistors are satisfied, design/mask patterns corresponding to the gate patterns can be corrected and thus a pattern data correction process can be accurately performed.

In addition, since the mask patterns corresponding to the gate patterns of the MIS transistors can be accurately corrected, an improvement in the performance of the entire semiconductor integrated circuit and manufacturing yields can be achieved, and accordingly, the development period of the semiconductor integrated circuit can also be reduced.

(2) Second Embodiment

In the first embodiment, an example has been described in which a correction process (OPC process) is performed on mask pattern data corresponding to gate patterns of MIS transistors having different threshold voltages. However, in an embodiment in an example of the present invention, a pattern data correction process by different size specs is not limited to that performed on MIS transistors having different threshold voltages. For example, types of MIS transistors of different conduction types, such as a P-channel type MIS transistor and an N-channel type MIS transistor, may be identified and the OPC process may be performed on pattern data thereof using different size specs.

A method of identifying P-channel type and N-channel type MIS transistors is performed as follows, for example.

Figure 5:
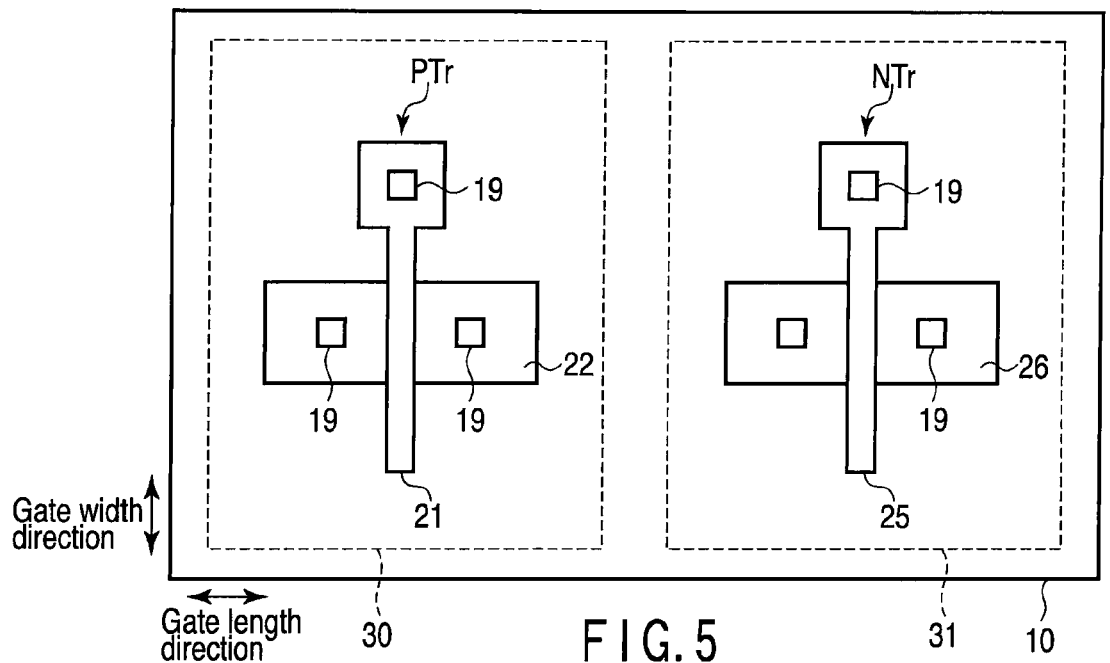
FIG. 5 is a diagram showing an example of pattern data of a second embodiment.

As shown in FIG. 5, a P-channel MIS transistor PTr has a p-type diffusion layer as a source/drain 22 and an N-channel MIS transistor NTr has an n-type diffusion layer as a source/drain 26.

That is, in a source/drain formation process, when the source/drain 22 of the P-channel MIS transistor is formed, a region where the N-channel type MIS transistor is formed is covered with a resist mask. On the other hand, when the source/drain 26 of the N-channel MIS transistor is formed, a region where the P-channel MIS transistor is formed is covered with a resist mask. Hence, from mask pattern data used in the respective source/drain formation processes, types of the MIS transistors can be identified.

The P-channel MIS transistor PTr is provided in an N-well region 30 provided within a semiconductor substrate and the N-channel MIS transistor NTr is provided in a P-well region 31 provided within the semiconductor substrate. In formation processes of the P-well region 30 and the N-well region 31 where the transistors are respectively provided, when the P-well region 30 is formed, a region where an N-well region is formed is covered with a resist mask. In contrast to that, when the N-well region 31 is formed, a region where a P-well region is formed is covered with a resist mask. Hence, also by mask pattern data used in the well-region formation processes, types of the MIS transistors of different conduction types can be identified.

When a polysilicon film is used as a gate electrode material, along with the formation of finer MIS transistors, gate depletion occurs. To prevent this, when silicide gate electrodes or metal gate electrodes are adopted as gate electrodes of the MIS transistors, different materials are used between a P-channel type and an N-channel type. For example, when, with a metal gate electrode, a threshold voltage of 0.1 to 0.2V is set, an electrode material having a work function of 4.3 eV or less is used for an N-channel MIS transistor and an electrode material having a work function of 4.9 eV or more is used for a P-channel MIS transistor, resulting in so-called dual metal gate electrodes in which the gate electrode materials of two types of work functions are used in the same chip. In this case, a gate electrode 21 of the P-channel MIS transistor and a gate electrode 25 of the N-channel MIS transistor are formed by different processes. Therefore, also by mask pattern data used in the gate electrode formation processes, types of the MIS transistors can be identified.

Note that correction size specs for the OPC process are differently set for respective P-channel type and N-channel type based on operating characteristics required thereby.

As described above, types of MIS transistors of different conduction types are identified and as with the first embodiment, based on the flow shown in FIG. 1, the OPC process is performed using correction size specs that are different for different conduction types and modified data corresponding to mask pattern data is modified and generated.

Therefore, according to the second embodiment of the present invention, without using the same strict size spec for MIS transistors having different operating characteristics in a design layout, but by using size specs that secure exposure margin within a range where the operating characteristics required by the respective transistors are satisfied, a pattern data correction process can be accurately performed.

In addition, according to the present embodiment, mask pattern data corresponding to gate patterns of the MIS transistors can be accurately corrected. Thus, an improvement in the performance of the entire semiconductor integrated circuit and manufacturing yields can be achieved, and accordingly, the development period of the semiconductor integrated circuit can also be reduced.

(3) Third Embodiment

In the first embodiment of the present invention, a pattern data generating method has been described in which mask pattern data is modified so as to fall within the range of size specs that are different for different types of MIS transistors. However, the pattern data generating method is not limited thereto; by applying size specs that are different for different types of MIS transistors of the same gate size, design pattern data may be corrected and a design layout may be generated.

For example, as with steps ST1 to ST4 shown in FIG. 1 of the first embodiment, types of MIS transistors are identified and correction size specs thereof are obtained and set. Then, design patterns corresponding to gate patterns are modified for each type of MIS transistor such that gate patterns predicted by simulation based on pattern data satisfy the correction size specs. Then, the modified design pattern data is output as modified data (ST6).

As described above, also by the design layout generating method of the third embodiment of the present invention, the same effects as those obtained in the first embodiment can be obtained.

(4) Fourth Embodiment

In the first and third embodiments, an example has been described in which pattern data is corrected so as to fall within the range of size specs that are different for different types of MIS transistors, whereby mask pattern data or design layout data is generated. However, the present invention is not limited thereto and it is also possible to verify whether corrections to gate patterns are appropriate, by using size specs that are different for different types of MIS transistors.

A pattern data verification method as a pattern data generation method according to a fourth embodiment of the present invention will be described below using FIG. 6.

First, as with the first embodiment, after design pattern data including a plurality of design patterns (layers) is input to the computer 1 (ST10), in a pre-processing process, arrangement of assist patterns with respect to the design pattern data, etc., are performed by the computer 1 (ST11). Note that, as with the first embodiment, the sizes of gate patterns of MIS transistors of the present embodiment in the design pattern data are designed with the same size, regardless of the type of MIS transistor. Then, an error check of a process risk area is performed on the design pattern data having been subjected to the pre-processing (ST12). Thereafter, the OPC process is performed on pattern data having process risk areas, and corrected pattern data shown in FIG. 7, for example, is generated (ST13).

At the same time, by the method shown in the first and second embodiments, types of the MIS transistors are identified based on the input design pattern data, and locations (coordinates) thereof are recognized by the computer 1 (ST14). Then, verification size specs are obtained from the database 3 by the computer 1 (ST15). Note that in the present embodiment, the verification size specs are substantially the same as, for example, correction size specs shown in the first embodiment and are defined by the same setting range as that of the correction size specs.

Then, for verifying corrected patterns, a lithography simulation based on the pattern data having been subjected to the OPC process is performed by the simulator 2 (ST16). In this verification process, whether the corrections (OPC process) to mask pattern data corresponding to the gate patterns of the MIS transistors are appropriate is determined in such a manner that simulation results, the identified types of the MIS transistors, and the verification size specs are associated with one another (ST17). The verification process is hereinafter referred to as the OPC verification process.

Figure 7:
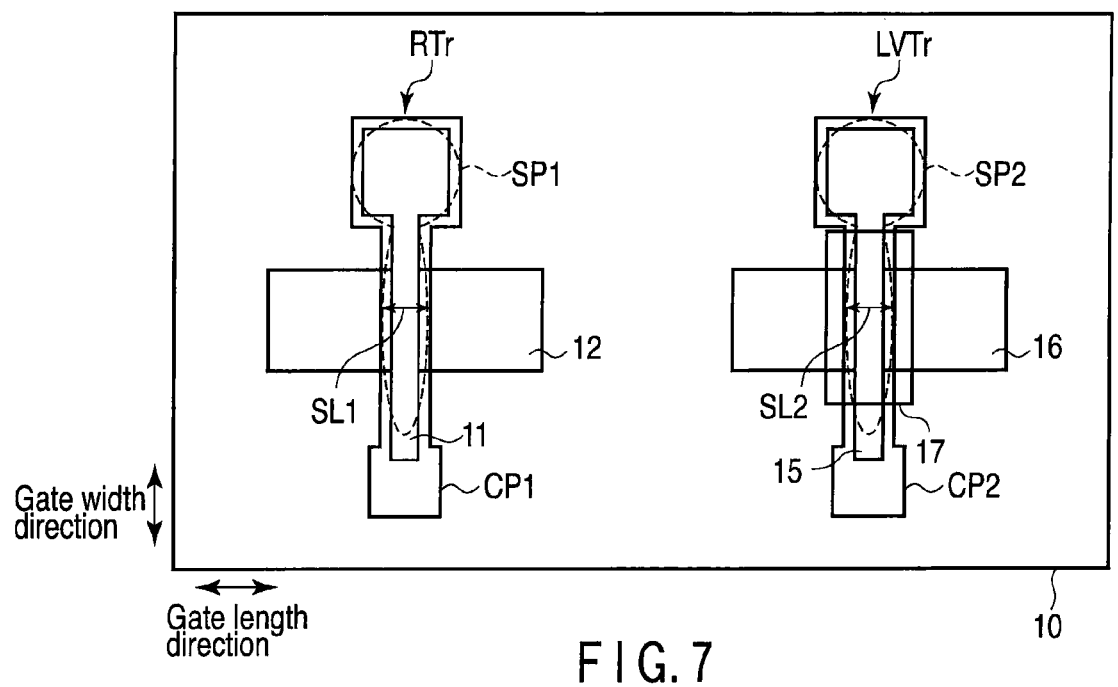
FIG. 7 is a diagram showing an example of simulation pattern data of transistors.

FIG. 7 shows simulation patterns SP1 and SP2 that are predicted by simulation. The patterns SP1 and SP2 indicate lithography simulation images to be transferred onto a wafer based on mask patterns corresponding to gate patterns of a standard MIS transistor and a low-voltage MIS transistor. From the simulation patterns SP1 and SP2, simulation gate lengths SL1 and SL2 are determined.

In the pattern data verification method of the present embodiment, it is verified whether the simulation gate lengths SL1 and SL2 obtained from corrected pattern data satisfy verification size specs.

That is, it is determined whether the gate length SL1 of the simulation pattern SP1 satisfies a verification size spec ($L1<L<Lmax$) of the standard MIS transistor. Similarly, it is determined whether the gate length SL2 of the simulation pattern SP2 satisfies a verification size spec ($Lmin<L<L2$) of the low-voltage MIS transistor. By thus verifying the corrections using the size specs (verification size specs) that are different for different types of MIS transistors, exposure margin can be secured for each type of MIS transistor within a range where operating characteristics required by the respective MIS transistors are satisfied, and thus, it is no longer necessary to verify operating characteristics of a semiconductor integrated circuit using the same strict size spec, as in conventional cases.

When simulation results for a correction process for all pattern data satisfy the verification size specs, the pattern data is output as final modified pattern data (ST18) and masks are manufactured based on the data (ST19). On the other hand, when, as shown in FIG. 7, corrected pattern data units CP1 and CP2 do not satisfy the size specs, pre-processing (ST11) or the OPC process (ST12) is repeatedly performed by, for example, software stored in the control unit 1A until the pattern data units satisfy the size specs.

As described above, according to the fourth embodiment of the present invention, size specs (verification size specs) of gate patterns are differently set for different threshold voltages of MIS transistors and it is verified whether gate pattern data of the MIS transistors is corrected within the range of the size specs.

Hence, according to the fourth embodiment of the present invention, without using the same strict size spec for MIS transistors having different operating characteristics in a design layout, but by using size specs that secure exposure margin within a range where the operating characteristics required by the respective transistors are satisfied, a pattern data correction process and a pattern data verification process with high accuracy can be performed.

In addition, since, according to the present embodiment, gate pattern data of the MIS transistors can be accurately corrected, an improvement in the performance of the entire semiconductor integrated circuit and manufacturing yields can be achieved, and accordingly, the development period of the semiconductor integrated circuit can also be reduced.

Note that although in the present embodiment, an example has been described in which MIS transistors having different threshold voltages are identified and the OPC verification is performed on gate patterns thereof, the verification is not limited thereto; as in the second embodiment, it is also possible to identify MIS transistors having different conduction types and perform the OPC verification on gate patterns thereof.

(5) Fifth Embodiment

While the pattern data verification method has been described in the forth embodiments, the present invention can also be applied to a computer-readable program storing such a verification method in a storage unit.

Figure 6:
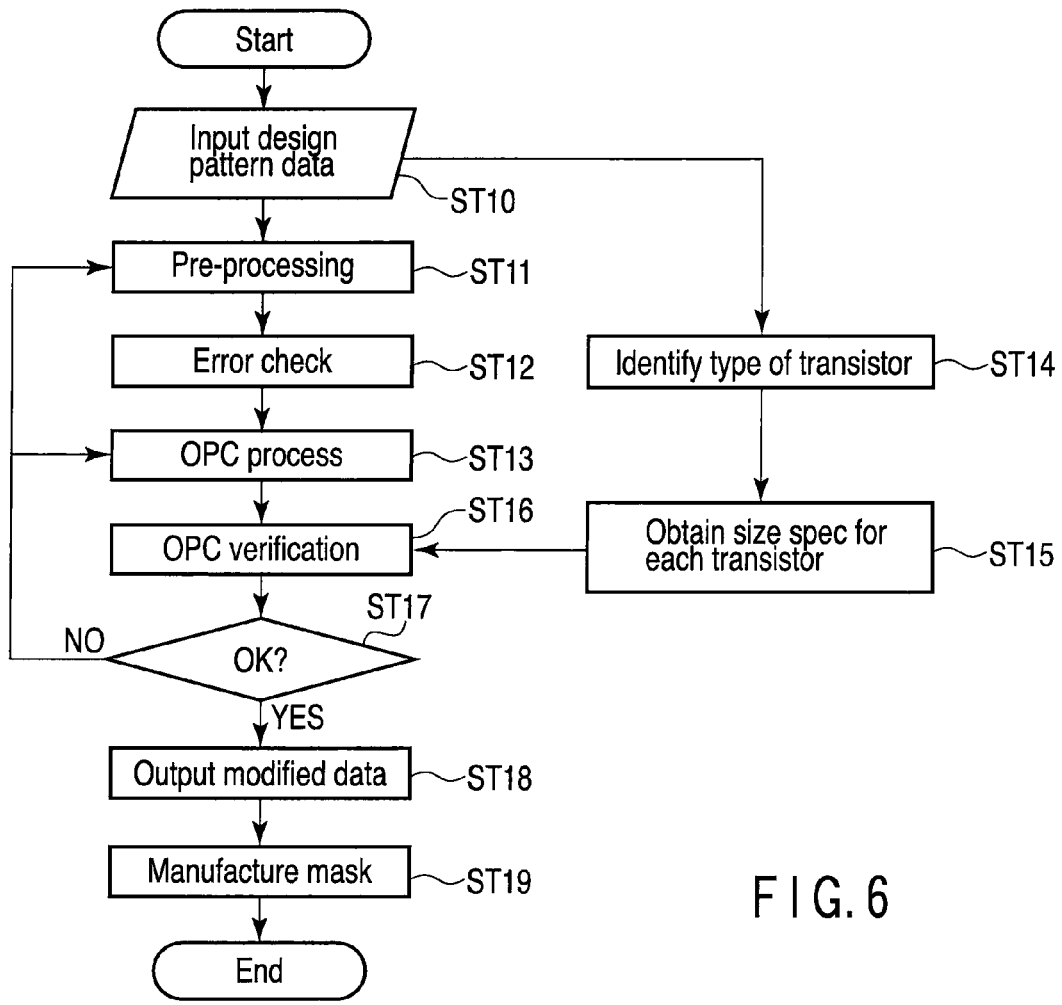
FIG. 6 is a flowchart showing a pattern data verification method of a third embodiment.

In this case, a program corresponding to the verification method of FIG. 6 is stored in, for example, a control unit 1A within the computer 2 shown in FIG. 2. It is to be noted that the program may be provided by being stored in storage unit (not shown) separately provide inside or outside the computer 2. It may also be provided via a communication line such as the Internet.

The control unit 1A causes an operation unit 1B to execute steps ST 10 to ST 19 in the flowchart shown in FIG. 6 on the basis of the stored program, same as the operation (the verification method) described in the fourth embodiment.

Therefore, according to the fifth embodiment of the present invention, without using the same strict size spec for MIS transistors having different operating characteristics in a design layout, but by using size specs that secure exposure margin within a range where the operating characteristics required by the respective transistors are satisfied, a pattern data correction process and a pattern data verification process with high accuracy can be performed.

It is to be noted that a program corresponding to the method shown in FIG. 1 may be stored in a storage unit and the program may be executed by computer 2.

(6) Sixth Embodiment

In a sixth embodiment of the present invention, particularly, an OPC process for pattern data will be described.

For example, as in the first and second embodiments, a plurality of design/mask pattern data units are input to the computer 1 shown in FIG. 2. Then, an error check for determining a process risk area is performed on the mask pattern data units. Then, an OPC process is performed on process risk areas.

Generally, the OPC process for pattern data is performed by directly changing the size of a mask pattern corresponding to a gate pattern. Here, it is known that a proximity effect upon pattern transfer occurs due to adjacent patterns affecting each other upon exposure. Therefore, without directly changing a pattern that is a correction target, but by changing the shape of an adjacent pattern, the shape of the pattern which is the correction target can also be indirectly changed.

Figure 8:
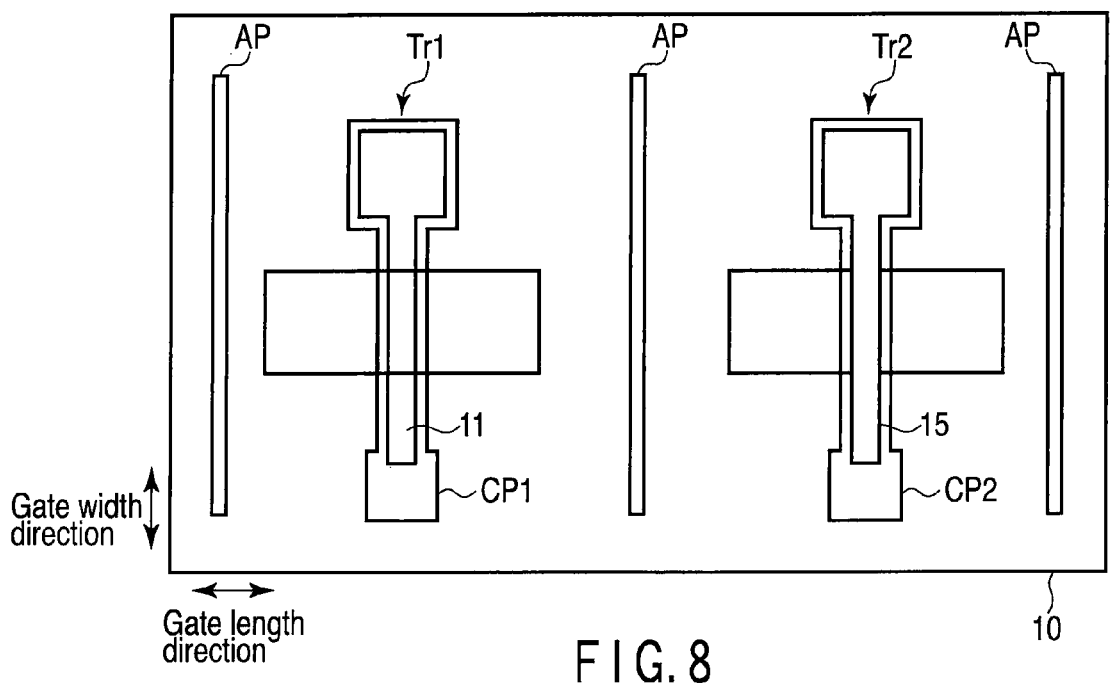
FIG. 8 is a diagram showing an example of pattern data of a sixth embodiment.

For example, as shown in FIG. 8, in design/mask pattern data 10 including mask patterns corresponding to gate patterns of MIS transistors, by pre-processing (ST1 and ST11) in FIGS. 1 and 6, assist patterns AP are arranged so as to be adjacent to patterns 11 and 15 for forming elements. In this case, by changing the pattern shapes/sizes of the assist patterns AP, shapes in pattern data corresponding to the gate patterns are adjusted, whereby the pattern data can be corrected.

Namely, according to the present embodiment, not only by directly correcting sizes in pattern data corresponding to gate patterns but also by changing pattern data (shapes) of assist patterns, mask pattern data is adjusted and modified data by which MIS transistors can obtain required characteristics can be generated.

Note that the correction process (OPC process) using assist patterns that is described in the present embodiment may be performed when the OPC process is performed using correction size specs in the first embodiment or may be performed in the OPC process performed before the OPC verification process in the fourth embodiment.

(7) Application Example

The pattern data generating methods of the embodiments of the present invention can be applied to a photomask manufacturing method. That is, by performing the OPC process and the OPC verification process shown in the embodiments of the present invention on mask patterns corresponding to gate patterns included in mask pattern data, final pattern data (modified data) is generated. Based on the mask pattern data and using electron beam exposure, patterns are drawn on a blanks substrate. As a result, photomasks are manufactured.

Hence, photomasks can be manufactured based on pattern data that satisfies operating characteristics required by MIS transistors and that has pattern sizes with high accuracy.

The pattern data generating methods of the embodiments of the present invention can also be applied to a semiconductor integrated circuit fabrication method. That is, based on final pattern data generated by the OPC process and the OPC verification process shown in the embodiments of the present invention, photomasks are manufactured. Patterns of the photomasks are transferred by an exposure apparatus onto a semiconductor substrate to which a resist is applied. Then, based on the transferred patterns, a conductive layer and an insulating layer formed on the semiconductor substrate are etched, whereby elements such as MIS transistors and resistance elements are formed. As a result, a semiconductor integrated circuit is fabricated.

Hence, a semiconductor integrated circuit can be fabricated based on mask pattern data that satisfies operating characteristics required by MIS transistors and that has pattern sizes with high accuracy.

Accordingly, by the application example of the embodiments of the present invention, an improvement in the performance of the entire semiconductor integrated circuit and manufacturing yields can be achieved.

3. Others

According to the examples of the present invention, a pattern data correction process and a pattern data verification process can be accurately performed. Furthermore, by avoiding correction/verification with a strict size spec, an improvement in the performance of the entire semiconductor integrated circuit and manufacturing yields thereof can be achieved and the development period of mask patterns can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern data generation method comprising:
based on design pattern data of a circuit including a plurality of MIS transistors having the same gate size, identifying, by using a computer, types of the plurality of MIS transistors;
setting, by using the computer, size specs for gate patterns of the plurality of MIS transistors, the size specs being different for different types of the MIS transistors; and
verifying, by using the computer, whether gate patterns of the MIS transistors predicted by simulation using mask pattern data for forming the MIS transistors satisfy the size specs.

2. The pattern data generation method according to claim 1, wherein in identifying the types of the plurality of MIS transistors, MIS transistors having different threshold voltages or being of different conduction types are identified.

3. The pattern data generation method according to claim 2, wherein a range between a lower-limit size spec and a size spec serving as a reference for a MIS transistor having a low threshold voltage is wider than a range between an upper-limit size spec and the size spec serving as the reference for the MIS transistor having the low threshold voltage.

4. The pattern data generation method according to claim 2, wherein a range between an upper-limit size spec and a size spec serving as a reference for a MIS transistor having a high threshold voltage is wider than a range between a lower-limit size spec and the size spec serving as the reference for the MIS transistor having the high threshold voltage.

5. The pattern data generation method according to claim 1, wherein identifying the types of the MIS transistors is performed based on design pattern data used for forming channel regions of the MIS transistors.

6. The pattern data generation method according to claim 1, wherein identifying the types of the MIS transistors is performed based on design pattern data used for forming source/drain regions of the MIS transistors.

7. The pattern data generation method according to claim 1, wherein identifying the types of the MIS transistors is performed based on design pattern data used for forming gate electrodes of the MIS transistors.

8. The pattern data generation method according to claim 1, wherein assist pattern data is arranged in the design pattern data and by changing shapes in the assist pattern data, the mask pattern data corresponding to the gate patterns is modified.

9. A design layout generating method comprising:
based on design pattern data of a circuit including a plurality of MIS transistors having the same gate size, identifying, by using a computer, types of the plurality of MIS transistors;
setting, by using the computer, size specs for gate patterns of the plurality of MIS transistors, the size specs being different for different types of the MIS transistors; and
modifying, by using the computer, design pattern data of the gate patterns of the MIS transistors such that gate patterns of the MIS transistors predicted by simulation using mask pattern data for forming the MIS transistors satisfy the size specs.

10. The design layout generating method according to claim 9, wherein in identifying the types of the plurality of MIS transistors, MIS transistors having different threshold voltages or being of different conduction types are identified.

11. The design layout generating method according to claim 10, wherein a range between a lower-limit size spec and a size spec serving as a reference for a MIS transistor having a low threshold voltage is wider than a range between an upper-limit size spec and the size spec serving as the reference for the MIS transistor having the low threshold voltage.

12. The design layout generating method according to claim 10, wherein a range between an upper-limit size spec and a size spec serving as a reference for a MIS transistor having a high threshold voltage is wider than a range between a lower-limit size spec and the size spec serving as the reference for the MIS transistor having the high threshold voltage.

13. The design layout generating method according to claim 9, wherein identifying the types of the MIS transistors is performed based on design pattern data used for forming channel regions of the MIS transistors.

14. The design layout generating method according to claim 9, wherein identifying the types of the MIS transistors is performed based on design pattern data used for forming source/drain regions of the MIS transistors.

15. The design layout generating method according to claim 9, wherein identifying the types of the MIS transistors is performed based on design pattern data used for forming gate electrodes of the MIS transistors.

16. The design layout generating method according to claim 9, wherein assist pattern data is arranged in the design pattern data and by changing shapes in the assist pattern data, the mask pattern data corresponding to the gate patterns is modified.

17. A non-transitory computer-readable storage medium storing a program which, when executed by a computer, causes the computer to:
based on design pattern data of a circuit including a plurality of MIS transistors having the same gate size, identify types of the plurality of MIS transistor;
set size specs for gate patterns of the plurality of MIS transistors, the size specs being different for different types of the transistors; and
verify whether gate patterns of the MIS transistors predicted by simulation using mask pattern data for forming the MIS transistor satisfy the size specs.

18. The computer-readable storage medium according to claim 17, wherein in identifying the types of the plurality of MIS transistors, MIS transistors having different threshold voltages or being of different conduction types are identified.

19. The computer-readable storage medium according to claim 18, wherein a range between a lower-limit size spec and a size spec serving as a reference for a MIS transistor having a low threshold voltage is wider than a range between an upper-limit size spec and the size spec serving as the reference for the MIS transistor having the low threshold voltage.

20. The computer-readable storage medium according to claim 18, wherein a range between an upper-limit size spec and a size spec serving as a reference for a MIS transistor having a high threshold voltage is wider than a range between a lower-limit size spec and the size spec serving as the reference for a MIS transistor having the high threshold voltage.

* * * * *

UNITED STATES PATENT AND TRADEMARK OFFICE
CERTIFICATE OF CORRECTION

| | |
|---|---|
| PATENT NO. | : 8,127,256 B2 |
| APPLICATION NO. | : 12/252978 |
| DATED | : February 28, 2012 |
| INVENTOR(S) | : Konomi |

Page 1 of 1

It is certified that error appears in the above-identified patent and that said Letters Patent is hereby corrected as shown below:

Claim 17, column 14, line 29, change "plurality of MIS transistor;" to --plurality of MIS transistors;--.

Signed and Sealed this
Tenth Day of July, 2012

David J. Kappos
*Director of the United States Patent and Trademark Office*